United States Patent [19]

Bender

[11] Patent Number: 4,627,062
[45] Date of Patent: Dec. 2, 1986

[54] AC DRIVEN LASER DIODE ARRAY, POWER SUPPLY, TRANSFORMER, AND METHOD THEREFOR

[75] Inventor: Gerald M. Bender, St. Louis County, Mo.

[73] Assignee: McDonnell Douglas Corporation, St. Louis, Mo.

[21] Appl. No.: 545,478

[22] Filed: Oct. 26, 1983

[51] Int. Cl.⁴ .............................................. H01S 3/04
[52] U.S. Cl. ..................................... 372/36; 357/17; 357/81; 372/38
[58] Field of Search ...................... 372/36, 38; 357/76, 357/81

[56] References Cited

U.S. PATENT DOCUMENTS 4,315,225  2/1982  Allen, Jr. et al. .................. 372/36

Primary Examiner—James W. Davie
Attorney, Agent, or Firm—Polster, Polster and Lucchesi

[57] ABSTRACT

An alternating current (AC) driven laser diode array and a power supply for the laser diode array is disclosed in which all of the laser diodes in the array are in conductive heat transfer relation with a high thermal conductivity heat sink and in which all of the diodes in the array are simultaneously pumped or energized by means of an AC power source via a transformer having a single primary coil and one or more secondary coils with each of the secondary coils energizing a plurality of diodes. A method of energizing a laser diode array with AC power is also disclosed.

15 Claims, 7 Drawing Figures

AC DRIVEN LASER DIODE ARRAY, POWER SUPPLY, TRANSFORMER, AND METHOD THEREFOR

BACKGROUND OF THE INVENTION

This invention relates to an alternating current (AC) driven laser diode array, to an AC power supply for a laser diode array, and to a method of energizing such a laser diode array with AC power.

Generally, a semiconductor laser array utilizes a stack or array of semiconductor devices, such as a pn junction diodes, which when energized (or pumped) to a level such that the lasing threshold of the diodes is exceeded (i.e., when the current density within the diode is such that a light pulse can travel a round trip within the resonating cavity of the diode), coherent radiation is emitted from the front, partially-reflecting facet of the laser diode. More particularly, a semiconductor laser array typically comprises a stack of pn junction diodes with each of the diodes being a small block of a suitable crystalline semiconductor material such as germanium, silicon, gallium arsenide (GaAs), gallium aluminum arsenide (GaAlAs), gallium arsenide phosphide (GaAsP), indium gallium arsenide phosphide (InGaAsP), or other suitable semiconductor material. Each of the laser diodes has a fully reflecting back facet and a partially reflecting front facet defining an optical resonating cavity (referred to as the Fabry-Perot cavity) with the front and rear facets being referred to as the Fabry-Perot surfaces of the laser diode.

In a semiconductor laser, the fundamental light producing mechanism in the diode is the recombination of electrons and holes when a conduction-band electron is captured by a valence-band hole. Pumping of the laser diode is accomplished by the injection of electrons across the pn junction. More specifically, the laser diode is positively biased with the p-side of the diode positive. At low current levels within the diode, the electrons recombine with the holes spontaneously emitting radiation in all directions. At higher current levels, an inverted population of carriers is achieved yielding a positive gain in the lasing region. When the current density exceeds the lasing threshold of the diode, a light pulse is able to traverse a round trip within the optical resonating cavity of the laser diode without attenuation and a coherent pulse of light will be emitted from the partially reflecting front facet of the diode.

The threshold current density of a laser diode is a strong function of temperature. Large current densities are required to achieve an inverted population of carriers. For example, at room temperature, current densities ranging between about 8,000 and 40,000 ampers/cm.$^2$ may be required. Above 100° K., the threshold current density is approximately proportional to the cube of the temperature. To minimize the self-generated Joule heating effects, laser diodes are typically periodically pulsed with each of the energized pulses having an energization time ranging between about 100-400 nanoseconds at a frequency ranging between about 1K and 10K Hz.

Certain semiconductor laser materials, such as a homojunction GaAs diode, have a relatively low room temperature efficiency (e.g., less than about 1%), but at cryogenic temperatures (e.g., 77° K.), these materials have efficiencies as high as 60%. This laser diode structure is usually cryogenically cooled. Single-heterostructure laser diodes, such as GaAlAs, have appreciably lower threshold current densities and have thus made room temperature (i.e., non-cryogenically cooled) diode lasers practical.

Double heterostructure laser diodes utilize a second GaAlAs layer at the pn junction so as to provide a wave guide within the diode, so that even lower threshold currents result, thus making continuous wave (CW) room temperature diode lasers possible.

Continuous wave or pulse operated laser diodes have many applications in fiber optic data transmission sensors, voice communications, and in ranging devices. In certain signalling applications where peak power output is more important than average power output, room temperature laser diode arrays are often times employed. Such laser diode arrays are shown in U.S. Pat. Nos. 3,514,715, 3,878,556, 3,962,655, 4,032,802, 4,069,463, and 4,298,869.

As previously mentioned, room temperature laser diodes are generally less efficient than cryogenically cooled laser diodes, thus requiring substantial amounts of heat to be dissipated. This is usually accomplished by incorporating heat sinks between the diodes of the array with the heat sinks conducting away heat from the diodes. Reference may be made to such U.S. Pat. Nos. 3,436,603, 3,694,703, and 3,921,201, which illustrate various semiconductor laser diode array cooling arrangements. Often times, the heat sinks for these laser diode arrays have fins or other heat dissipation surfaces over which air or other heat transfer mediums may be circulated to carry away the dissipated heat.

Typically, each of the front facets of the laser diodes in a stack or array is in communication with a respective fiber optic fiber which in turn are bundled and fed to a suitable optical integrator or the like, depending on the particular application for the diode laser. Also, the stacks or arrays of laser diodes may be arranged in a circular configuration centered generally on the fiber optic bundle, with the emitting facets of the various laser diodes of the diode arrays being directed generally radially inwardly so that a large number of the laser diode arrays can be compactly arranged with respect to the optical integrator, and such that the length of the fiber optic fibers from the diodes to the optical integrator is minimized.

A variety of pulsed power supplies have been developed for driving or pumping laser diodes and laser diode arrays. These power supplies include delay line SCRs, capacitor SCRs, SCR pulse transformers, avalanche transistors, transistors, mechanical relays, and gas tube circuits. However, these systems supply DC power to the laser diode or diode arrays. Generally, each of these prior art power supplies includes a trigger circuit, electronic switches, protective circuits, and a primary power source. The limitations on voltage and/or current of the electronic switching elements (e.g., SCRs or transistor switches) require that the laser diodes in a multiple diode array be electrically connected in series-parallel circuits. Thus, as the number of diodes increases, impedance mismatching problems may arise.

A conductively cooled, DC-powered laser diode array was developed which operated with a continuous wave (CW) output. Also, so-called burst modulated diode pumps have been developed in which a laser diode array is powered by a square or rectangular wave form. However, the construction of the conductively cooled diode arrays had such a high value of electrical capacitance that it was not practical to use the above-mentioned burst modulation pumping technique.

SUMMARY OF THE INVENTION

Among the several objects and features of the present invention may be noted the provision of a laser diode array and method of driving or pumping the laser diode array such that the diodes are energized with AC electrical power and with the diodes being effectively electrically connected in series, but with one facet of each of the diodes being physically connected together by a highly thermally conductive path or heat sink with no intervening electrical insulators between the diode and the heat sinks;

the provision of such a laser diode array and method which is more efficient at room temperature operating conditions than with other known laser diode arrays and energization methods;

the provision of such a laser diode array and method which has a high peak power output and a low duty cycle, thereby minimizing the Joule heating effects within the laser diodes of the array;

the provision of such a laser diode array and method in which heat is efficiently from the laser diodes and is transfered to a cooling medium (e.g., air);

the provision of such a laser diode array and method in which the diodes are energized via a relatively simple coaxial cable;

the provision of such a laser diode array and method in which the diodes may be conveniently pulse modulated (rather than sinusoidally modulated) thereby to result in greater operating efficiency and in less inernal heat generation within the diodes;

the provision of such a laser diode array and method in which a transformer is utilized as the power source for the diode array, thus ensuring that all of the diodes are effectively series connected to the power source at the same time while providing parallel conductive heat paths for the removal of internally-generated heat from within the diodes;

the provision of such a laser diode array and method in which AC power enhances the service life of the diode array;

the provision of such a laser diode array and method in which the power supplied to all of the diodes in the array is substantially equal;

the provision of such a laser diode array and method in which each of the diodes may have a grounded terminal;

the provision of such a laser diode array and method in which no two diodes are electrically connected in parallel;

the provision of such a laser diode array and method which utilizes AC electrical power and a transformer so as to energize all of the diodes in the array such that only one transformer secondary coil need be provided for every four diodes; and the provision of such a laser diode array and method which is relatively easy to manufacture, to electrically connect to its source of AC power, which is efficient in operation and which has a long service life.

Other objects and features of this invention will be in part pointed out and in part apparent hereinafter.

Briefly stated, a laser diode array of the present invention comprises a plurality of laser diodes each having a junction and a light emitting facet, these diodes generally being arranged in a column or row. Each of the diodes further has a pair of opposed contact faces and each diode is assembled in a diode sandwich. Each of these diode sandwiches includes an electrode in face-to-face electrical and thermal conductive contact with one contact face of the respective diode, and heat sink means is in face-to-face electrical and thermal conductive contact with the other contact face of the diode. Each diode sandwich further includes a layer of electrical insulation between the electrode and the heat sink means. The diode sandwiches are stacked one on the other such that the electrode of one diode sandwich is in conductive heat transfer relation with the heat sink means of a next adjacent diode sandwich whereby heat from both contact facets of each of said diodes is conductively transferred away from the diodes via the electrode and heat sink means.

Further, in accordance with this invention, a power supply for a laser diode array is provided wherein the laser diode array is generally as described above, with the diodes being arranged in groups or sets. The power supply comprises a transformer having a primary coil energizable by a source of alternating electrical current and a plurality of secondary coils, one for each of the sets of diodes, with each of the secondary coils being simultaneously energized by the primary coil such that all of the diodes in the array have substantially similar currents flowing therethrough when the diodes are energized.

The method of this invention of energizing or pumping a diode array, generally as above described, comprises arranging the diodes in groups or sets with each set having a plurality of diodes therein and at least two electrodes. These electrodes are connected to the above-mentioned secondary coil of the transformer so that upon energization of the primary coil of the transformer with a desired alternating current wave form, certain of the diodes in each of the diode sets are energized during one portion of the wave form (e.g., the positive portion) while others of the diodes are non-light generative, and during the other portion of the wave form (e.g., the negative portion), the first-mentioned diodes are non-light generative and the other diodes are energized.

DESCRIPTION OF PREFERRED EMBODIMENTS

Figures 1, 2:
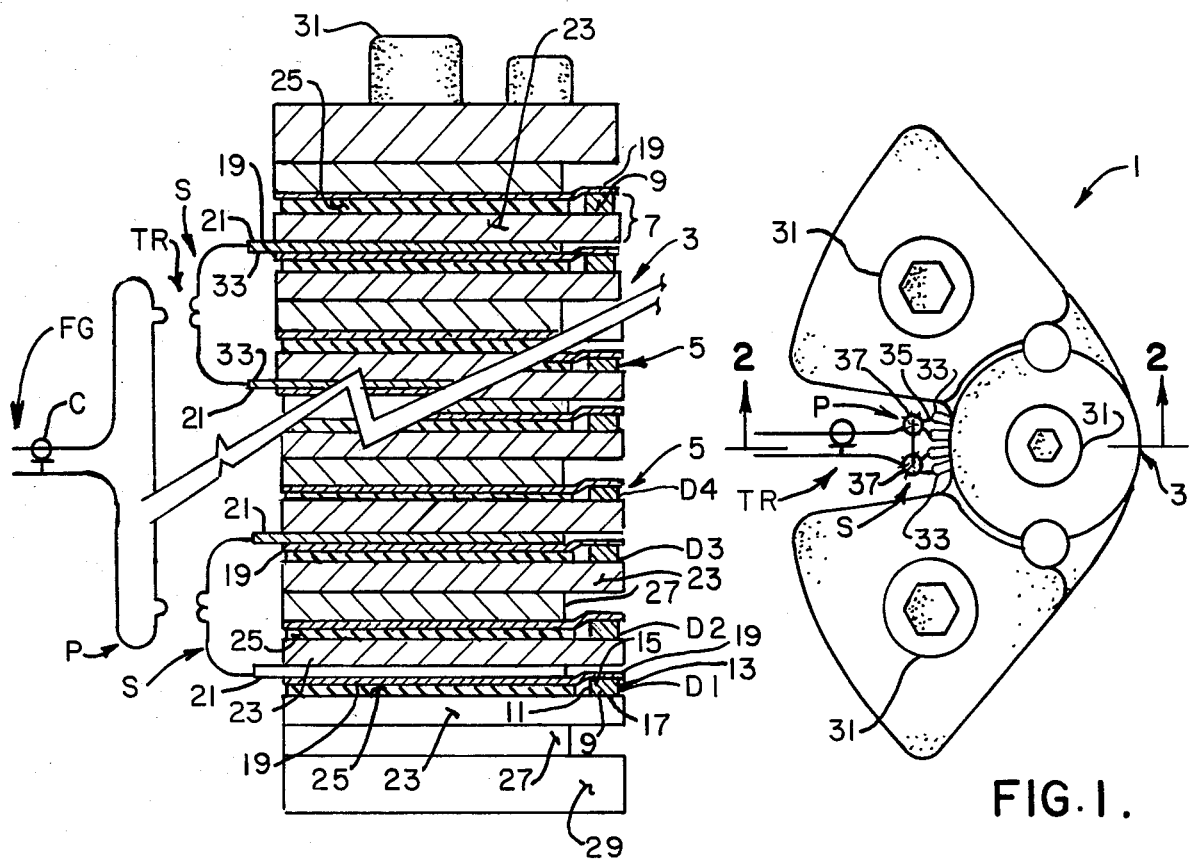
FIG. 1 is a top plan view of a laser diode array of the present invention on a somewhat enlarged scale for purposes of clarity.
FIG. 2 is a vertical cross section, taken along line 2—2 of FIG. 1, with the scale of the thickness of the various components being enlarged for purposes of clarity and with FIG. 2 illustrating the construction of diode sandwiches of the diode array of the present invention and further, in semi-diagrammatic form, illustrating the alternating power supply of the present invention.

Referring now to the drawings, a diode laser of the present invention is illustrated in its entirety by reference character 1. The diode laser is shown to include a laser diode array, as generally indicated at 3. In FIG. 2, laser diode array 3 is shown to comprise a plurality of laser diodes 5 which are arranged in groups or sets of four diodes each, with the diodes of each group being indicated at D1, D2, D3 and D4.

Even more specifically, each of the diode groups comprises a plurality of diode sandwiches, each of which is generally indicated at 7, with each of the diode sandwiches comprising a diode block 9 of suitable crystalline semiconductor material, such as Gallium Aluminum Arsenide (GaAlAs), with each of the crystalline diode blocks having a reflecting back facet 11, a partially reflecting front facet 13, and a pair of opposed contact faces including a first contact face 15 and a second contact face 17. Further, each of the diode sandwiches 7 includes an electrode plate 19 in electrical and thermal conductive contact with one contact face (e.g., contact face 15) of diode block 9. The electrode plate 19 is in electrical and thermal conductive contact with an electrode 21. A heat sink plate 23 of copper or the like is disposed below each of the respective diode blocks 9. The other contact face 17 of each of the diode blocks is in thermal and electrical conductive contact with the heat sink plate which in turn is in thermal and electrical conductive contact with heat sink plate 23. A layer of electrical insulation 25 is interposed between electrode plate 19 and heat sink plate 23 so that an electrical potential may be generated across the pn junction of the diode block 9 upon energization of the diode array in a manner as will appear. However, it will be noted that even with electrical insulation layer 25 in place between electrode plate 19 and heat sink plate 23, both of the opposed electrical contact faces 15 and 17 of the diode block are in conductive heat transfer relation with relatively large heat sink components (i.e., one face 15 of which is in contact with electrode plate 19 which in turn is in conductive contact with electrode 21 and with copper plate 23 above the contact face 15, and the other face 17 of which is in heat conductive contact with the copper plate 23 below contact face 17 with this last-noted plate 23 being in heat conductive contact with the heat sink 27) such that heat generated within the diode blocks 9 upon energization thereof may be readily thermally conducted away from their opposed contact faces 15 and 17 thereby to maintain the diodes at a relatively cool operating condition.

As best illustrated in FIG. 2, a plurality of the diode sandwiches 7, as above-described, is assembled in a stack or array such that the diode blocks 9 of the diode array 3 are arranged generally in a vertical column or line with the front, partially reflecting facets 13 of the diodes (i.e., the light-emitting facets of the diodes) being generally co-planar in the vertical direction.

Figures 3, 5:
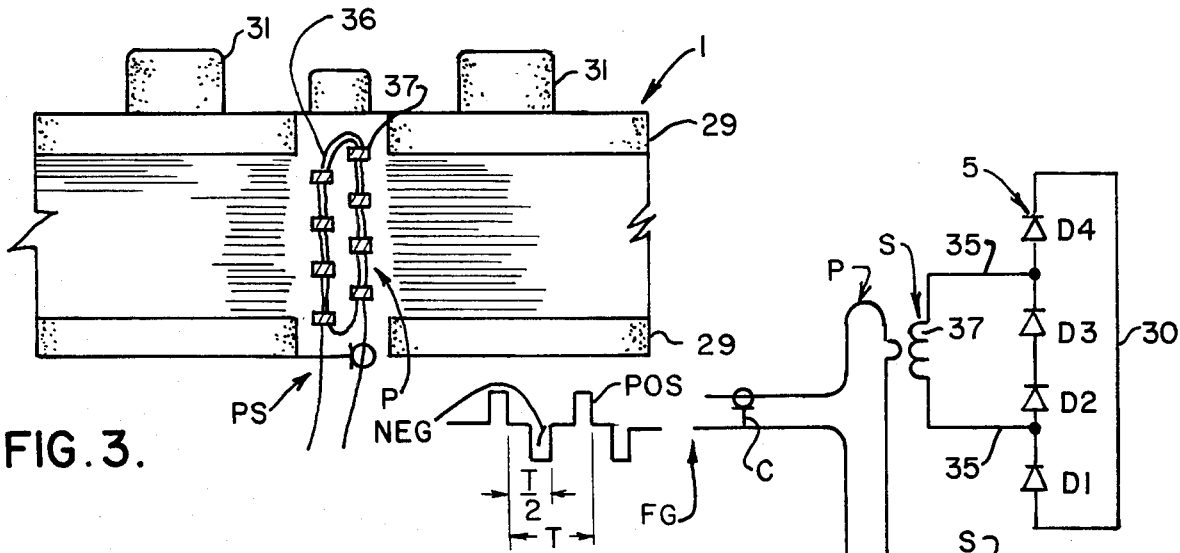
FIG. 3 is a left side elevational view of FIG. 1.
FIG. 5 is an electrical schematic of various sets of diodes with each of sets being energized by a secondary coil of the transformer power supply of the present invention.
Figure 4:
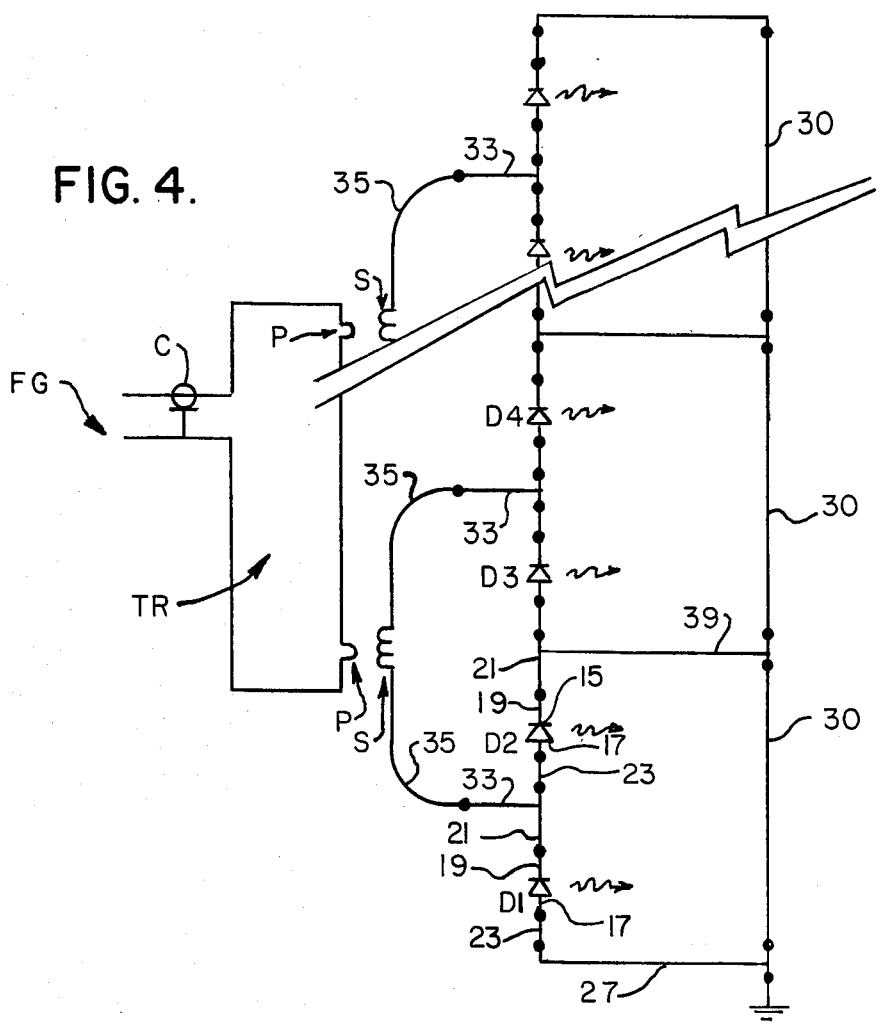
FIG. 4 is a schematic of the diode array and the alternating current (AC) power supply of the present invention.

Copper heat sink end caps, as generally indicated at 29, are applied to each end of the diode array and cap screws 31 extend through heat sinks 27, electrodes 21, and copper spacers between the heat sinks and the electrodes such that all of the above-mentioned members are securely drawn together in face-to-face contact thereby assuring good electrical and thermal conduction between the heat conducting members of the diode array or stack. Additionally, it will be understood that the electrical path through the electrodes, heat sinks, and spacers, as indicated at 30 in FIGS. 4 and 5, is provided such that the diodes D1-D4 of a diode group are connected in the manner shown in FIGS. 4 and 5. Referring to FIG. 2, the thickness of electrode plates 19, electrodes 21, heat sink plates 25, and heat sinks 27 are shown in greatly exaggerated scale. For example, heat sink plates 25 may have a thickness of about 7 mils.

Figure 6A:
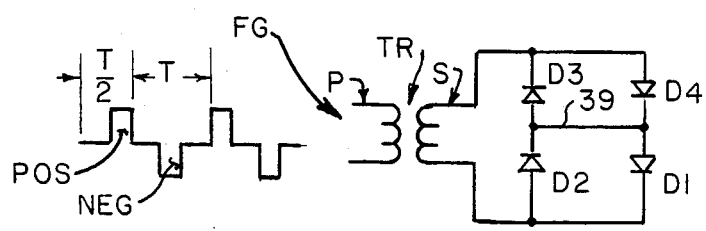
FIGS. 6A and 6B schematically illustrate the effective electrical connection pattern of the diodes in each of the diode groups or sets of the diode array of the present invention when energized by a rectangular alternating current wave form such that the duty cycle of each of the diodes is relatively small in relation to its period.
Figure 6B:
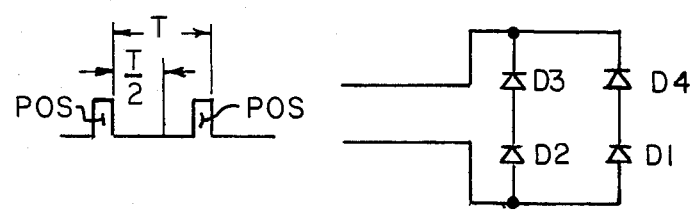

Further in accordance with this invention, diodes 5 of the diode array 3 of the present invention are energized by an alternating current (AC) power supply PS in which an alternating waveform, preferably a square or rectangular waveform, as shown in FIGS. 5, 6A, and 6B, is impressed upon the primary coil P of a transformer T so as to simultaneously energize all of the diodes 5 within the diode arrays by means of a plurality of secondary coils S, there being one secondary coil S for each of the diode groups or sets in the diode array. More specifically, as best shown in FIG. 2, a pair of electrodes 21 is provided for each diode group D1, D2, D3 and D4. Electrodes 21 have terminals 33 extending out from one end thereof for purposes as will appear.

As best shown in FIGS. 1 and 2, lead wires 35 for secondary coils S of transformer TR are electrically connected to terminals 33 so that the diode groups, as indicated by diodes D1-D4 in FIGS. 4 and 5, are simulataneously energized by their respective secondary coils upon energization of the primary coil P of the transformer TR. Even more specifically, the secondary coils S each include a secondary core 37 (see FIG. 2) of suitable magnetic material, such as ferrite, with secondary coil wires 35 wrapped about the core and with the coil wires constituting the primary coil P extending through the central opening of the cores, as best shown in FIGS. 1 and 3. In this manner, depending on the number of turns in primary coil P and depending on the number of turns in the secondary windings S of the transformer TR, a predetermined voltage is impressed upon each of the secondary windings of transformer TR so as to drive the diodes D1-D4 of each diode group substantially simultaneously with the other diode groups in diode array 3 for the simultaneous excitation of all of the diodes 5 in the array.

With primary coils 36 of the primary winding P passing through the opening of each of the magnetic cores 37 of each of the secondary windings S, each of the secondary windings is energized simultaneously by the voltage impressed on the primary winding by the power source or function generator FG. Further, the number of turns of primary coils 36 in primary winding P is preferably different than the number of coil wires 35 for each of the secondary windings bears the relationship to the current in the primary windings as the inverse of the number of times in the primary winding relative to the number of turns or coils in the secondary winding. Moreover, the secondary windings are electrically isolated from the primary winding, but are electromagnetically coupled thereto and are effectively in series with each other so as to preserve the relationship of the currents.

As shown in FIGS. 5, 6A, and 6B, the alternating current waveform generated by a function generator (not shown) and is delivered to laser diode 1 by a coaxial cable C is a square waveform having a period of cycle time T and further having a positive waveform portion POS and a negative waveform portion NEG. Even more specifically, the wave form shown in FIGS. 5 and 6A are so-called rectangular waveforms wherein the positive and negative portions of the waveform have an energization time somewhat less than T/2 such that the total energization time during the period T is only a fraction of the period T.

With the rectangular waveforms shown in FIGS. 5 and 6A impressed on the primary coil P of transformer TR, and with the diodes D1–D4 of each diode group arranged as diagrammatically shown in FIG. 4, each diode group is essentially comprised of two sets of diodes (e.g., diodes D1 and D4, and diodes D2 and D3) with each set being arranged in series. The two diode sets of each diode group are arranged in parallel, as shown in FIGS. 6A and 6B, so that one set (e.g., diodes D1 and D4) conduct when the positive portion of the waveform POS is impressed on the primary coil P. During the positive portion of the waveform and during the nonconducting portions of the waveform cycle, the other group of diodes D2 and D3 will be nonconducting. Then, when the negative portion of the waveform NEG is impressed on transformer TR from the function generator FG, the other set of diodes D2 and D3 will become conductive while the other diodes D1 and D4 will be nonconductive. It will be appreciated that the conductor 39 extending between the two diode groups D1, D4 and D2, D3 may be ignored, as shown in FIG. 6B, because no current is conducted therethrough. Further, if the waveform is symmetrical, then the positive and negative cycles of the waveform will impress equal voltages on the diodes. Accordingly, the circuit as shown in FIG. 6B has the equivalent effect wherein only the positive waveform pulses PS are utilized, however, in this instance, all four diodes D1–D4 of each diode group will be energized at the same time rather than being energized in pairs during alternating halves of the cycle. Thus, each pair of diodes D1, D4 and D2, D3 are in parallel with its opposite pair, but each diode group is in effective series with the other diode groups in the array. Thus, it is desirable that each pair of diodes D1, D4 and D2, D3 of one group be matched with similar diode pairs of other diode groups so that all of the diodes energized during one phase of the waveform be operable at equal voltages at their desired current levels.

It will be appreciated that since each pair of diodes D1, D4 and D2, D3 of each diode group is energized by a respective positive or negative waveform portion, each diode operates for 50% or less of the time of each period T, and thus the duty factor of each diode is less than 50%. This, in turn, limits the joule self-heating effect on the diodes. When square waveforms are utilized with substantially no off-time between the positive and negative waveform portions, the duty factor of each pair of diodes will be approximately 50%.

In view of the above, it will be seen that the other objects of this invention are achieved and other advantageous results obtained.

As various changes could be made in the above constructions or method without departing from the scope of the invention, it is intended that all matter contained in the above description or shown in the accompanying drawing shall be interpreted as illustrative and not in a limiting sense.

What is claimed is:

1. A laser diode array comprising a plurality of laser diodes each having a junction, a light emitting facet, and having a pair of opposed contact faces, said diodes each being assembled in a diode sandwich, each said diode sandwich including an electrode in face-to-face electrical and thermal conductive contact with one of said contact faces of said diode and a heat sink in face-to-face electrical and thermal conductive contact with the other of said contact faces of said diode, said diode sandwich further comprising a layer of electrical insulation between said electrode and said heat sink, said diode sandwiches being stacked one on the other such that the electrode of one diode sandwich is in conductive heat transfer relation with the heat sink of a next adjacent diode sandwich whereby heat from both contact faces of said diode is conductively transferred away therefrom via said electrode and said heat sink, said heat sink comprising a heat sink electrode in electrical and thermal contact with said other contact face of said diode and a heat sink plate in face-to-face contact with said heat sink electrode, each said heat sink being electrically connected to a power supply and to one another so as to be of substantially the same electrical potential, and said power supply comprising an alternating current power supply for exciting said diodes and for generating a coherent light emitted from said diodes.

2. A laser diode array as set forth in claim 1 further including means for securely holding said diode sandwiches in firm thermal and electrical conductive contact with one another.

3. A laser diode array as set forth in claim 1 wherein said power supply connects at least one set of four adjacent diodes of said array into a circuit substantially equivalent to a full-wave bridge with a shorted center bridge.

4. A laser diode array as set forth in claim 3 wherein said power supply supplies a cyclical voltage waveform having a period of predetermined length to said set of diodes such that two of said diodes of said set are nonconducting while the other two diodes of said set are conducting.

5. A laser diode array as set forth in claim 4 wherein said alternating current power supply is a transformer having a primary winding and at least one secondary winding such that each said set of diodes has a respective secondary winding associated therewith.

6. A laser diode array as set forth in claim 5 wherein each of said secondary windings comprises a core having an opening therethrough, said primary winding extending through said opening in said core whereby all of said secondary windings are substantially simultaneously energized by said primary winding.

7. A laser diode array as set forth in claim 6 wherein said primary winding has a number of primary winding coil sets therein, there being one primary winding coil set for each of said secondary windings and with each of said primary winding coil sets being serially electrically connected to one another.

8. A laser diode array as set forth in claim 4 wherein said alternating current waveform is substantially a rectangular waveform.

9. A laser diode array as set forth in claim 8 wherein said substantially rectangular waveform has a first portion for energizing said other two diodes, and a second waveform portion for energizing said two of said diodes.

10. A laser diode array as set forth in claim 9 wherein said waveform has a period T with the termination side of one portion of the waveform being less than or equal to T/2.

11. A laser diode array as set forth in claim 9 wherein said waveform has a period T and further has a dwell between the first and second portions of the waveform with the first and second portions of the waveform having an energization time less than T/2.

12. A laser diode array comprising a plurality of laser diodes each having a junction, a light emitting facet, and having a pair of opposed contact faces, said diodes each being assembled in a diode sandwich, each said diode sandwich including an electrode in face-to-face electrical and thermal conductive contact with one of said contact faces of said diode and a heat sink in face-to-face electrical and thermal conductive contact with the other of said contact faces of said diode, said diode sandwich further comprising a layer of electrical insulation between said electrode and said heat sink, said diode sandwiches being stacked one on the other such that the electrode of one diode sandwich is in conductive heat transfer relation with the heat sink of a next adjacent diode sandwich whereby heat from both contact faces of said diode is conductively transferred away therefrom via the last said electrode and heat sink, and in which said diodes are repeatedly energizable between a conducting state and a nonconducting state by means of an alternating current power supply, said power supply comprising a transformer having a primary coil energizable by said alternating current and a plurality of secondary coils, one secondary coil for each of said sets of diodes, each of said secondary coils being simultaneously energized by said primary coil.

13. The laser diode array of claim 12 wherein said alternating current has a first waveform portion of one voltage value, and a second waveform portion of a lower voltage value with certain of the diodes being in their conducting state when said first waveform portion is applied thereto, and being in their nonconducting state when said second waveform portion is applied thereto.

14. A laser diode array comprising a plurality of laser diodes each having a junction, a light emitting facet, and having a pair of opposed contact faces, said diodes each being assembled in a diode sandwich, each said diode sandwich including an electrode in face-to-face electrical and thermal conductive contact with one of said contact faces of said diode and a heat sink in face-to-face electrical and thermal conductive contact with the other of said contact faces of said diode, said diode sandwich further comprising a layer of electrical insulation between said electrode and said heat sink, said diode sandwiches being stacked one on the other such that the electrode of one diode sandwich is in conductive heat transfer relation with the heat sink of a next adjacent diode sandwich whereby heat from both contact faces of said diode is conductively transferred away therefrom via the last said electrode and heat sink, and in which said diodes are repeatedly energizable between a conducting state and a nonconducting state by means of an alternating current source including a transformer, said transformer having a single primary winding energizable by said alternating source and a plurality of secondary windings, said primary winding comprising a plurality of primary coils, each of said secondary windings comprising a respective magnectic core having an opening therethrough and a plurality of secondary coils, said primary coils passing through said opening of said megnetic core of each of said secondary windings, said alternating current source for energizing said primary winding in turn simultaneously energizing each of said secondary windings such that the current impressed on said secondary windings bears the inverse relationship between the ratio of said number of said coils in the primary winding relative to the number of said coils in the secondary windings, said secondary windings being electrically isolated from but effectively electromagnetically coupled to said primary winding so as to preserve the relationship between the currents in said primary and second windings.

15. A laser diode array comprising a plurality of laser diodes each having a junction, a light-emitting facet, and a pair of opposed contact faces, said diodes each being assembled in a diode sandwich, each said diode sandwich including an electrode in face-to-face electrical and thermal conductive contact with one of said contact faces of said diode and a heat sink in face-to-face electrical and thermal conductive contact with the other of said contact faces of said diode, each said diode sandwich further comrising a layer of electrical insulation between its respective said electrode and heat sink, said diode sandwiches being stacked one on the other such that the electrode of one diode sandwich is in conductive heat transfer relation with the heat sink of a next adjacent diode sandwich whereby heat from both contact faces of said diode of each diode sandwich is conductively transferred away therefrom via the last said electrode and heat sink, a power source for energizing the diodes of said array, said power source having a first side and a second side, and wherein said heat sink for each of said diodes comprises a heat sink electrode in electrical and thermal contact with said other contact face of said diode and a heat sink plate in face-to-face contact with said heat sink electrode, said heat sink electrode for one of said diode sandwiches being of the same electrical potential relative to one side of said power supply as said electrode in contact with one face of said next adjacent diode and said electrode in contact with said other face of said diode being of the same electrical potential relative to the other side of said power supply as the heat sink electrode of another next adjacent diode sandwich.

* * * * *